US008667333B2

(12) United States Patent
Hill (10) Patent No.: US 8,667,333 B2
(45) Date of Patent: Mar. 4, 2014

(54) EXTENSIBLE TESTING SYSTEM

(75) Inventor: David T. Hill, Bedford, IN (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 342 days.

(21) Appl. No.: 13/149,858

(22) Filed: May 31, 2011

(65) Prior Publication Data

US 2012/0136613 A1 May 31, 2012

Related U.S. Application Data

(60) Provisional application No. 61/350,319, filed on Jun. 1, 2010.

(51) Int. Cl.
*G06F 11/00* (2006.01)

(52) U.S. Cl.
USPC .............................. 714/33; 702/119; 702/120

(58) Field of Classification Search
USPC .......................................................... 714/33
See application file for complete search history.

(56) References Cited

U.S. PATENT DOCUMENTS

| | | | |
|---|---|---|---|
| 5,157,779 A * | 10/1992 | Washburn et al. | 714/37 |
| 6,311,320 B1 | 10/2001 | Jibbe | |
| 6,463,552 B1 | 10/2002 | Jibbe | |
| 6,571,358 B1 | 5/2003 | Culotta et al. | |
| 6,832,182 B1 | 12/2004 | Wilson | |
| 6,882,951 B2 | 4/2005 | Eden et al. | |
| 7,318,727 B2 * | 1/2008 | Bowers | 434/118 |
| 8,131,845 B1 | 3/2012 | Vasudeva | |
| 2002/0087649 A1 | 7/2002 | Horvitz | |
| 2002/0091496 A1 | 7/2002 | Cheng et al. | |
| 2002/0162059 A1 | 10/2002 | McNeely et al. | |
| 2003/0056150 A1 | 3/2003 | Dubovsky | |
| 2003/0196170 A1 * | 10/2003 | Bowers | 715/513 |
| 2004/0158787 A1 | 8/2004 | Zayas et al. | |
| 2004/0163076 A1 | 8/2004 | Zayas et al. | |
| 2004/0220765 A1 | 11/2004 | Gluch | |
| 2006/0036907 A1 | 2/2006 | Inscoe et al. | |
| 2006/0184691 A1 | 8/2006 | Hu | |
| 2008/0082886 A1 | 4/2008 | Rasmussen et al. | |
| 2008/0155086 A1 | 6/2008 | Jensen | |
| 2008/0310439 A1 | 12/2008 | Gale et al. | |
| 2009/0024874 A1 | 1/2009 | Proto | |
| 2009/0247134 A1 | 10/2009 | Jeide et al. | |
| 2009/0259612 A1 | 10/2009 | Hanson | |
| 2011/0238786 A1 | 9/2011 | Fontaine | |
| 2012/0136609 A1 * | 5/2012 | Hill | 702/117 |
| 2012/0136613 A1 * | 5/2012 | Hill | 702/119 |
| 2012/0136955 A1 * | 5/2012 | Hill | 709/207 |
| 2012/0137175 A1 * | 5/2012 | Hill | 714/27 |

FOREIGN PATENT DOCUMENTS

CN -10124644 8/2008

OTHER PUBLICATIONS

Harris et al., Open Signals, Open Software: Two Years of Collaborative Analysis using the GPS Toolkit, Sep. 29, 2006.
National Instruments Corporation, Designing Next Generation Test Systems; An In-Depth Developers Guide, Aug. 2006.
Renfro et al., The Open Source GPS Toolkit: A Review of the First Year, Sep. 2005.

* cited by examiner

*Primary Examiner* — Kamini Patel
(74) *Attorney, Agent, or Firm* — Christopher A. Monsey (57) ABSTRACT

A computer implemented system for testing electronic equipment where a plurality of types of systems can be tested using a single test specification.

15 Claims, 10 Drawing Sheets

Sample Output

```
;----------------------------------------------------------------
; TRIB                                              Version 6.66a
;----------------------------------------------------------------
;                      Written by Dave Hill
;                    Code 6058 NSWC Crane Division
;                       Crane, Indiana 47522
;
;
;
;----------------------------------------------------------------
;c:\projects\trib\trib.ini
;
;[TRIB]
;Delay=1
;Seconds=15
;Errors=100
;Verbose=1
;
;[1]
;Trial=sift c:\trib.tmp 1000000 | abyss
;Iterations=1
;
;[2]
;Trial=sift d:\trib.tmp 1000 | abyss
;Iterations=1
;
;[3]
;Trial=sift \\SP-HILLDT\shared\trib.tmp 1000 | abyss
;Iterations=1
;
;[4]
;Trial=satan \\SP-HILLDT\HPLJ4 SATAN\x20\T\f\Ez | abyss
;Delay=300
;Iterations=1
;                 710  720  730  740  750  760
;----------------------------------------------------------------
;Day and Hour Trial  Mark  War's  Err's  Source
;----------------------------------------------------------------
 329 08:17:56    1     .     0      0 sift
!329 08:17:56    2    44     0      1 sift
;    Application Error
;    Wed Nov 26 08:17:56
;    sift d:\trib.tmp 1000 | abyss
;    Resource busy.
 329 08:17:56    3     .     0      1 sift
~329 08:17:56    1    26     1      1 Application Popup
;    System Information
;    Wed Nov 26 08:17:56
;    mkfault.exe - Application Error
;    The instruction at "0x0000000b" referenced memory at "0x0000000b". The me
;    mory could not be "read".
;    Click on OK to terminate the program
;    Click on CANCEL to debug the program
!329 08:17:57    2    19     1      2 sift
;    Application Error
;    Wed Nov 26 08:17:57
;    sift d:\trib.tmp 1000 | abyss
;    Invalid argument.
 329 08:17:57    3     .     1      2 sift
 329 08:17:58    1     .     1      2 sift
```

Fig. 7b

```
!329 08:17:58      2    44     1      3 sift
;      Application Error
;      Wed Nov 26 08:17:58
;      sift d:\trib.tmp 1000 | abyss
;      Resource busy.
 329 08:17:58      3     .     1      3 sift
 329 08:17:59      1     .     1      3 sift
!329 08:17:59      2    44     1      4 sift
;      Application Error
;      Wed Nov 26 08:17:59
;      sift d:\trib.tmp 1000 | abyss
;      Resource busy.
 329 08:17:59      3     .     1      4 sift
~329 08:18:00      1    27     2      4 E1000
;      System Information
;      Wed Nov 26 08:18:00
;      Intel(R) PRO/1000 MT Network Connection
;      - 0000 00 00 04 00 02 00 58 00    ......X.
;      - 0008 00 00 00 00 1B 00 04 40    .......@
;      - 0010 00 00 00 00 00 00 00 00    ........
;      - 0018 00 00 00 00 00 00 00 00    ........
;      - 0020 00 00 00 00 00 00 00 00    ........
;      - 0028 1B 00 04 40                ...@
!329 08:18:00      2    44     2      5 sift
;      Application Error
;      Wed Nov 26 08:18:00
;      sift d:\trib.tmp 1000 | abyss
;      Resource busy.
 329 08:18:00      3     .     2      5 sift
 329 08:18:01      1     .     2      5 sift
!329 08:18:01      2    44     2      6 sift
;      Application Error
;      Wed Nov 26 08:18:01
;      sift d:\trib.tmp 1000 | abyss
;      Resource busy.
 329 08:18:01      3     .     2      6 sift
~329 08:18:01      1    26     3      6 E1000
;      System Information
;      Wed Nov 26 08:18:01
;      Intel(R) PRO/1000 MT Network Connection
;      - 0000 00 00 04 00 02 00 58 00    ......X.
;      - 0008 00 00 00 00 1A 00 04 40    .......@
;      - 0010 00 00 00 00 00 00 00 00    ........
;      - 0018 00 00 00 00 00 00 00 00    ........
;      - 0020 00 00 00 00 00 00 00 00    ........
;      - 0028 1A 00 04 40                ...@
~329 08:18:01      1  4201     4      6 Tcpip
;      System Information
;      Wed Nov 26 08:18:01
;      Intel(R) PRO/1000 MT Network Connection
;      - 0000 00 00 00 00 02 00 50 00    ......P.
;      - 0008 00 00 00 00 69 10 00 40    ....i..@
;      - 0010 02 00 00 00 00 00 00 00    ........
;      - 0018 00 00 00 00 00 00 00 00    ........
;      - 0020 00 00 00 00 00 00 00 00    ........
!329 08:18:02      2    44     4      7 sift
;      Application Error
;      Wed Nov 26 08:18:02
;      sift d:\trib.tmp 1000 | abyss
;      Resource busy.
 329 08:18:02      3     .     4      7 sift
 329 08:18:03      1     .     4      7 sift
```

Fig. 7c

```
!329 08:18:03     2    44      4      8 sift
;    Application Error
;    Wed Nov 26 08:18:03
;    sift d:\trib.tmp 1000 | abyss
;    Resource busy.
 329 08:18:03     3     .      4      8 sift
 329 08:18:04     1     .      4      8 sift
!329 08:18:04     2    44      4      9 sift
;    Application Error
;    Wed Nov 26 08:18:04
;    sift d:\trib.tmp 1000 | abyss
;    Resource busy.
 329 08:18:04     3     .      4      9 sift
 329 08:18:05     1     .      4      9 sift
!329 08:18:05     2    44      4     10 sift
;    Application Error
;    Wed Nov 26 08:18:05
;    sift d:\trib.tmp 1000 | abyss
;    Resource busy.
 329 08:18:05     3     .      4     10 sift
 329 08:18:06     1     .      4     10 sift
!329 08:18:06     2    44      4     11 sift
;    Application Error
;    Wed Nov 26 08:18:06
;    sift d:\trib.tmp 1000 | abyss
;    Resource busy.
 329 08:18:06     3     .      4     11 sift
 329 08:18:07     1     .      4     11 sift
!329 08:18:07     2    19      4     12 sift
;    Application Error
;    Wed Nov 26 08:18:07
;    sift d:\trib.tmp 1000 | abyss
;    Invalid argument.
 329 08:18:07     3     .      4     12 sift
 329 08:18:08     1     .      4     12 sift
!329 08:18:08     2    44      4     13 sift
;    Application Error
;    Wed Nov 26 08:18:08
;    sift d:\trib.tmp 1000 | abyss
;    Resource busy.
 329 08:18:08     3     .      4     13 sift
```

FIG. 8

EXTENSIBLE TESTING SYSTEM

CROSS REFERENCE TO RELATED APPLICATIONS

This application claims priority to U.S. Provisional Application 61/350,319 filed Jun. 1, 2010, the disclosure of which is expressly incorporated herein by reference. Additionally, this application is being co-filed with applications bearing the titles of CORRELATED TESTING SYSTEM Ser. No. 13/149,855, BINARY DEFINITION FILES Ser. No. 13/149,854, and GPS EMBEDDED INTERACTIVE NETWORK INTERFACE Ser. No. 13/149,853, the disclosures of which are also expressly incorporated herein by reference.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon.

FIELD OF THE DISCLOSURE

The present disclosure relates generally to methods and systems for testing electronic equipment, and more particularly to methods and systems for testing electronic equipment where test protocols can be administered in a uniform way to a system that is able to readily convert the input into a format suitable for the particular piece of electronic equipment under test.

BACKGROUND AND SUMMARY OF THE DISCLOSURE

In a variety of different contexts, it is desirable to test electronic equipment and collect data from the tests for evaluation and analysis. Particular pieces of electronic equipment require input that is specifically tailored. Accordingly, administering a test to multiple types of electronics can require redundant programming for each piece of equipment.

The present disclosure provides a computer implemented system for conducting testing of electronic devices. The system includes a first processing sequence that retrieves a first data specification for a first electronic device species according to a first plurality of commands specified by a user; a second processing sequence that retrieves a first test protocol according to a second plurality of commands specified by a user, the first test protocol being configured to test any species of electronic device within a genus of electronic devices; a third processing sequence that executes the first test protocol to generate a first data structure, the first data structure being generic with respect to species within the genus of electronic devices; a fourth processing sequence that interprets the first data specification for the first electronic device species and extracts data from the first data structure according to the interpretation of the first data specification; a fifth processing sequence that generates a second data structure specific to the first electronic device species using data extracted from the first data structure and according to instruction contained within the first data specification for the first electronic device species; a sixth processing sequence that outputs the second data structure to a first device of the first electronic device species; a seventh processing sequence that receives a third data structure from the first device of the first electronic device species; and an eighth processing sequence that interprets the data specification for the first electronic device species and extracts data from the third data structure according to the interpretation of the first data specification.

A second embodiment of the present disclosure provides a computer implemented method for conducting testing of electronic devices. The method including: retrieving a data specification for an electronic device species in response to a first plurality of commands specified by a user; retrieving a test protocol in response to a second plurality of commands specified by a user, the test protocol describing a test suitable for any species of electronic device within a genus of electronic devices; executing the test protocol to generate a first data structure, the first data structure being generic with respect to species within the genus of electronic devices; extracting data from the first data structure; generating a second data structure by organizing the extracted data according to instructions provided by the data specification for the electronic device species; receiving a third data structure generated by a device of the electronic device species; extracting data from the third data structure according to instructions present within the data specification for the electronic device species; and generating a fourth data structure by organizing the data extracted from the third data structure according to instructions provided by the data specification for the electronic device species.

Yet another embodiment of the present disclosure provides a computer readable medium storing code for controlling a testing system to dynamically generate a client-type-specific testing instruction and client-type-generic testing response. The code includes instructions to: retrieve a data specification for an electronic device species in response to a first plurality of commands specified by a user; retrieve a test protocol in response to a second plurality of commands specified by a user, the test protocol describing a test suitable for any species of electronic device within a genus of electronic devices; execute the test protocol to generate a first data structure, the first data structure being generic with respect to species within the genus of electronic devices; extract data from the first data structure; generate a second data structure by organizing the extracted data according to instructions provided by the data specification for the electronic device species; receive a third data structure generated by a device of the electronic device species; extract data from the third data structure according to instructions present within the data specification for the electronic device species; and generate a fourth data structure by organizing the data extracted from the third data structure according to instructions provided by the data specification for the electronic device species.

Yet another embodiment of the present disclosure provides a software conversion system comprising a user interface adapted to permit a user to control processing and to select input files, a first system for converting a first plurality of control system data into a second plurality of control system data, wherein said first plurality of control system data is generic with respect to at least a first target system, said second plurality of control system data is specific with respect the first target system, the first system converting the first plurality of control system data into the second plurality of control system data by associating bit representations of the first plurality of control system data with a first plurality of predetermined data identifiers associated with said second control system data, wherein said user interface is further adapted to permit a user to manually associate said first plurality of bit representations with said first plurality of predetermined data identifiers.

These and other features of the present disclosure will become more apparent and the subject matter of the disclosure will be better understood by reference to the following description of embodiments of the disclosure taken in conjunction with the accompanying drawings.

Although the drawings represent embodiments of various features and components according to the present disclosure, the drawings are not necessarily to scale and certain features may be exaggerated in order to better illustrate and explain the present disclosure. The exemplifications set out herein illustrate embodiments of the disclosure, and such exemplifications are not to be construed as limiting the scope of the disclosure in any manner.

DETAILED DESCRIPTION

For the purposes of promoting an understanding of the principles of the disclosure, reference will now be made to the embodiments illustrated in the drawings, which are described below. It will nevertheless be understood that no limitation of the scope of the disclosure is thereby intended. The disclosure includes any alterations and further modifications in the illustrated system and described method and further applications of the principles of the disclosure, which would normally occur to one skilled in the art to which the disclosure relates. Moreover, the embodiments were selected for description to enable one of ordinary skill in the art to practice and implement the principles described herein.

Figure 1:
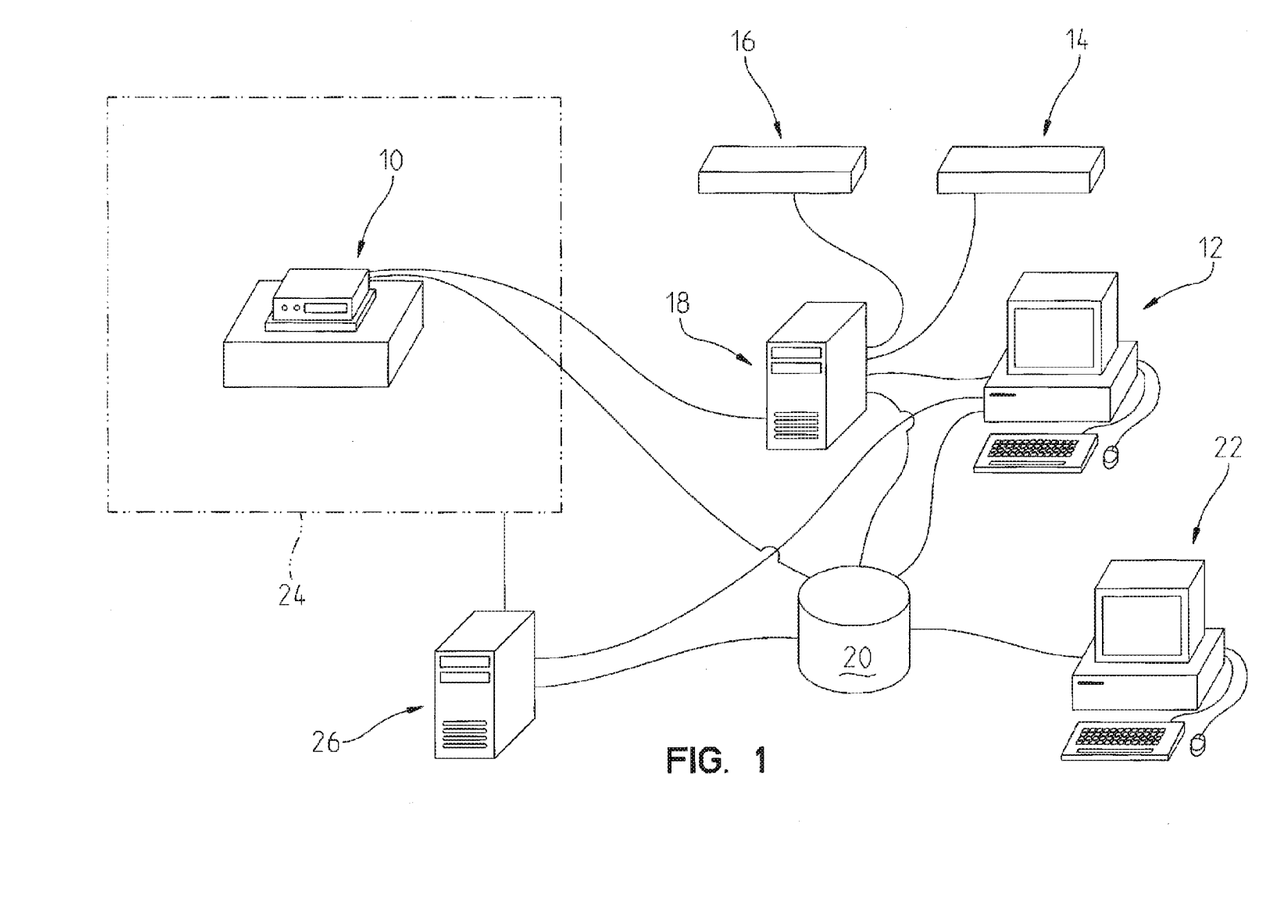
FIG. 1 is an illustrative system for testing an electronic device.

The method and system of the present disclosure are configured to test and report on functionality of an electronic device 10 under various conditions. The system includes a plurality of networked devices including testing interface computer 12, first automated data source 14, second automated data source 16, collating server 18, reporting database 20, reporting display computer 22, and environmental chamber 24 including chamber control computer 26.

Figure 2:
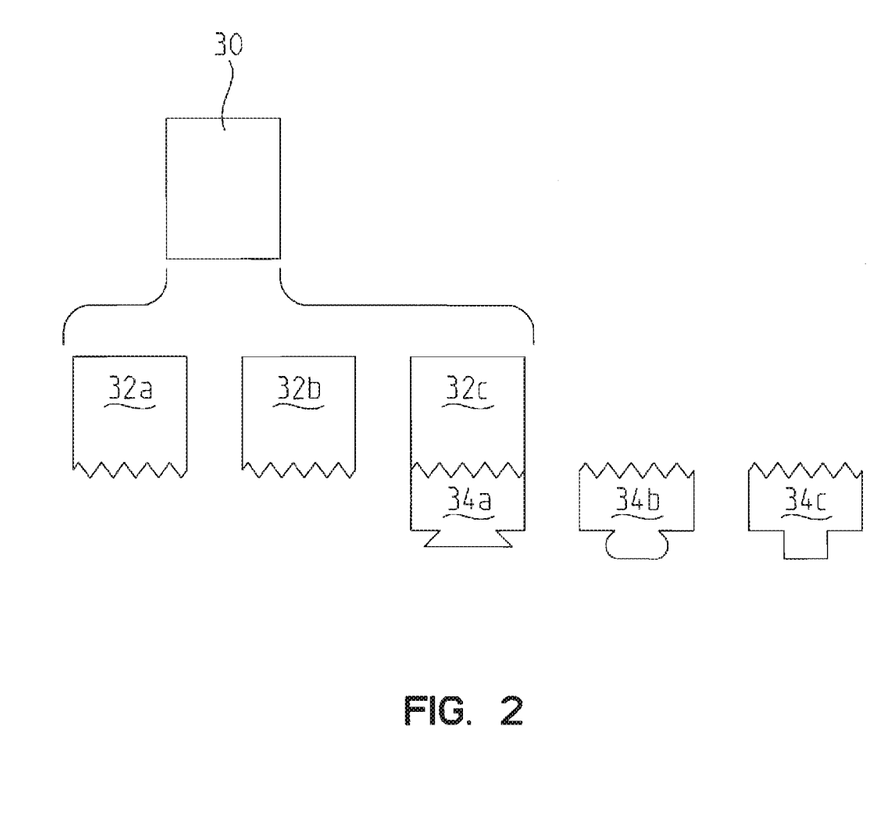
FIG. 2 is a conceptual diagram of program parts that operate in the system of FIG. 1.

Interface computer 12 is a general purpose computer capable of operating a command line shell program 30. Shell program 30 is a command interpreter that facilitates the development of device independent test procedures. Shell program 30 includes a plurality of testing protocol data files 32a-c. Each testing protocol file includes instructions therein to produce a data file that effects a different test for electronic device 10. Shell program 30 further includes a plurality of binary definition files 34a-c. Each binary definition file 34a-c is specific to a particular model of electronic device 10.

Testing protocol data files 32a-c are created by a user fluent in the programming language and by a subject matter expert who is an expert in what needs to be tested in the electronic devices. The expertise of the subject matter experts includes knowledge of what commands and inputs need to be delivered and in what order they are delivered as well as knowledge of required outputs. Testing protocol data files 32a-c generate generic data files that encapsulate the necessary input data for electronic device 10 under test. The fact that the output is generic is illustrated by the consistent saw edge of each test protocol data file 32a-c. Accordingly, testing protocol data files 32a-c are generic with respect to the class, or genus, of devices 10 that the system is designed to test. For example, a class or genus of devices could include, motherboards, DVD players, GPS devices (professional or consumer grade), cell phones, DBS receivers, or most anything that accepts electronic input and generates an output. Thus, for a system designed to test cell phones, test protocol data files 32a-c are designed to and capable of testing any cell phone.

However, all devices within a genus of devices, such as cell phones, do not contain the same hardware or operate identically. Accordingly, commands suitable for generating a desired response in one species of the genus of devices may not work for a different species of device within the genus. Accordingly, testing interface computer 12 utilizes binary definition files 34a-c. It should be appreciated that while only three binary definition files 34 (and only three test protocols 32) are shown, an unlimited number thereof are envisioned.

Binary definition files 34a-c are each specific to a particular species of device 10 within the genus of devices (this specificity is illustrated by the individualized lower end of binary definition files 34a-c). Each binary definition file 34a-c can receive the output from any protocol data file 32a-c (as illustrated by matching saw pattern upper edge) and then transform the generic test protocol file into a specific data file for the specific device 10 under test. Binary definition files 34a-c process data within the generic test protocol file bitwise. Each bit of information within the generic test protocol is individually handled by the relevant binary definition file 34a-c to generate the relevant specific data file. Like the test protocol files 32a-c, the specific device under test, and thus the binary definition file 34a-c to be used are specified by a user at user interface computer 12. In this way, the programming of testing interface computer 12 provide an extensible testing platform that is easily extended to not-yet-conceived species of electronic devices 10. Similarly, new test protocols 32a-c can be developed for all species of electronic devices 10 without having to create a new test file for every species of electronic device 10 on which the test is desired to run.

Figure 3:
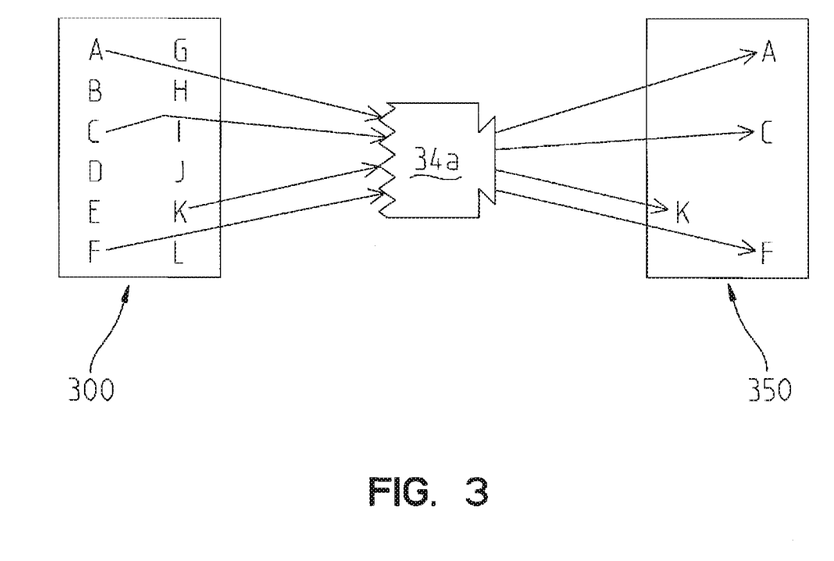
FIG. 3 is a conceptual diagram of the programatical operation of a part of the program of FIG. 2.

Each test protocol data file 32a-c of the present disclosure share the characteristic of having a fixed format for arranging the raw data produced thereby for output (previously described as being generic with respect to all species within the genus). FIG. 3 provides an example of a portion of one such raw data file 300. As shown, data file 300 includes a plurality of information blocks or data sets 102, (shown as blocks A-L).

Binary definition file 34a, shown in FIG. 3, receives raw data file 300 and unpacks it. Binary definition file 34a, being specific to a particular species of device 10, knows both the generic format of raw data file 300 and also the specific format of data file 350 that is required by the identified species of device 10. Accordingly, binary data file 34a constructs data file 350 by pulling data from raw data file 300 and placing the information into the format of data file 350. Data file 350 is subsequently compiled and output to device 10 under test. While specific test protocol data files 32a-c and specific binary definition files 34a-c may be discussed herein, it should be appreciated that any other test protocol data file 32a-c and/or binary definition file 34a-c could be used when different tests and or species of device are desired.

Figure 4:
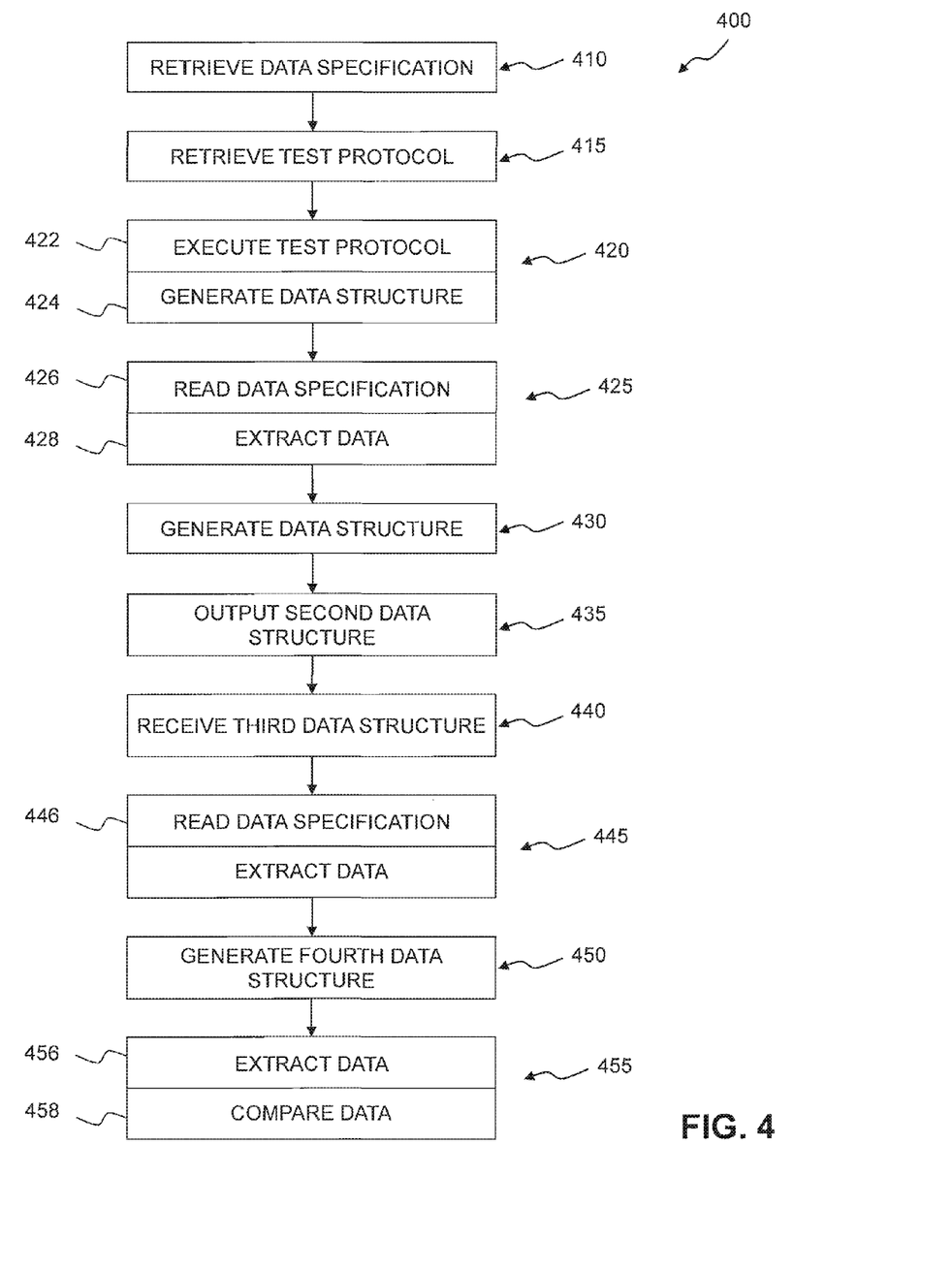
FIG. 4 is a flowchart showing the operation of a testing interface program and terminal of FIG. 1.

Referring now to FIG. 4, there is depicted a diagram of the various processing sequences and data structures employed by the present system and method in software/utility 400.

In general, a computer implemented system according to the principles of the present disclosure includes a first data specification retrieving sequence 410, a first test protocol retrieving sequence 415, a test protocol executing sequence 420, a data specification interpreting sequence 425, a second data structure generating sequence 430, a second data structure outputting sequence 435, a third data structure receiving sequence 440, a data specification interpretation and data extraction sequence 445, a fourth data structure generating sequence 450, and a data extraction and comparison sequence 455.

First data specification retrieving sequence 410 includes code for execution by a processor of testing interface computer 12 for retrieving a first data specification for a first electronic device species. Sequence 410 is initiated via the entering of commands by a user of testing interface computer 12. The first data specification, in the present example, takes the form of binary definition file 34. Binary definition file 34 includes information therein about the data requirements for the first electronic device that has been identified by the user.

First test protocol retrieving sequence 415 includes code for execution by a processor of testing interface computer 12 for retrieving a first data test protocol for a genus of electronic devices, of which the first electronic device species is a member. Sequence 415 is initiated via the entering of commands by the user of testing interface computer 12.

Test protocol executing sequence 420 includes code for execution by a processor of testing interface computer 12 for performing a plurality of functions. More specifically, as depicted at 422 test protocol executing sequence 420 executes the test protocol. Additionally, as depicted at 424, test protocol executing sequence 420 generates raw data file/first data structure 300. Raw data file/first data structure 300 is a test file that is generic with respect to all species within the selected genus of electronic devices.

Data specification interpreting sequence 425 includes code for execution by a processor of testing interface computer 12 for performing a plurality of functions. More specifically, as depicted at 426, data specification interpreting sequence 425 reads the first data specification 34. Additionally, as depicted at 428, data specification interpreting sequence 425 extracts data from the raw data file/first data structure 300 according to the instructions present within the first data specification 34. This sequence is also illustrated in FIG. 3.

Second data structure generating sequence 430 includes code for execution by a processor of testing interface computer 12 for generating a second data structure 350 that is species specific. As also illustrated in FIG. 3, sequence 430 takes the data that was extracted in sequence 425 and reconstitutes it as a new data structure 350 that is in a format specific to the particular species of electronic device 10 being tested. Second data structure 350 is formed according to the instructions contained in binary definition file/data specification 34.

Second data structure outputting sequence 435 includes code for execution by a processor of testing interface computer 12 for outputting second data structure 350 to electronic device 10. It should be appreciated that embodiments are envisioned where second data structure 350 is not output directly to electronic device 10. Rather, in such embodiments, as shown in FIG. 1, testing interface computer 12 outputs second data structure 350 to collating server 18 which then after processing, forwards the data structure to electronic device 10.

Once the second data structure 350 is provided to electronic device 10, the electronic device 10 acts upon the input as appropriate. Electronic device 10 then generates an output in response to receiving and processing the second data structure 350. This output is in the form of a third data structure.

Third data structure receiving sequence 440 includes code for execution by a processor of testing interface computer 12 for receiving the third data structure output by electronic device 10. Again, it should be appreciated that embodiments are envisioned where the third data structure is not transmitted directly from electronic device 10 to testing interface computer 12, but rather is transmitted through an intermediary device, such as collating server 18.

Data specification interpretation and data extraction sequence 445 includes code for execution by a processor of testing interface computer 12 for performing a plurality of functions. More specifically, as depicted at 446, data specification/binary definition file 34 is again invoked/read and interpreted. Additionally, as depicted at 448, data is extracted from third data structure according to the interpretation of the data specification/binary definition file 34.

Fourth data structure generating sequence 450 includes code for execution by a processor of testing interface computer 12 for taking the data extracted from the third data structure and generating a fourth data structure that uses the data extracted from the third data structure. The fourth data structure is generic with respect to the genus of electronic devices. The fourth data structure is in a standardized format that is readily understood and expected by the test protocol being executed by testing interface computer 12.

Data extraction and comparison sequence 455 includes code for execution by a processor of testing interface computer 12 for performing a plurality of functions. More specifically, as depicted at 456, data is extracted from the fourth data structure as directed by the test protocol. Additionally, as depicted at 458, the extracted data is compared to expected result data. If the extracted data meets the passing criteria, such as by matching the expected passing result, then the response data embodied in the third and fourth data structures is held to have passed the test. If the extracted data does not meet the passing criteria, the response data is held to have failed the test. It should be appreciated that the entire data structure can but need not be evaluated as a whole, rather pieces of data within the response data structures can be held to pass the test while other pieces can be held to fail. Furthermore, rather than only categorizing the data into pass and fail, it is envisioned to have multiple gradations of passing and failing such as full pass, qualified pass, pass with poor performance, etc. Passing criteria, or the criteria for categorizing the output, is held in a interface control document that provides a listing of various output possibilities and categorization for each output possibility. In the present example, the first and fourth data structures are comma delimited files. The second and third data structures may also be comma delimited files, but are dependent upon the electronic device 10 being tested and the data structure required thereby. Additionally, second and third data structures may be in a format suited for collating server 18. Additional processing of second and third data structures may occur at collating server 18.

It should be appreciated that the system of the current disclosure can be readily adapted to perform a second test on electronic device 10 by having the user of testing interface computer 12 call a different test protocol. Similarly, the first test can be performed on a different species of electronic device 10 by having the user of testing interface computer 12 identify the different electronic device 10 and calling the first test protocol. Even further, the second test can be performed on a different species of electronic device 10 by having the user of testing interface computer 12 identify the second test and different electronic device 10 via testing interface computer 12.

Referring back to FIG. 1, first and second automated data sources 14, 16 are provided. First and second automated data sources 14, 16 are data sources that device 10 is in communication with during normal operation thereof. Such data sources 14, 16 in the case of device 10 being a DBS receiver can be signals from one or more DBS transponders. In the case of a stereo receiver, data sources 14, 16 can be an audio source. In the case of a motherboard or any integrated circuit, automated data sources 14, 16 can be any number of automated data streams that typically interface therewith. In the case of professional GPS devices, automated data sources 14, 16 can be aiding data sources. Each of the aforementioned data sources are provided as examples and not to limit the possibilities of automated data sources 14, 16.

Figure 6:
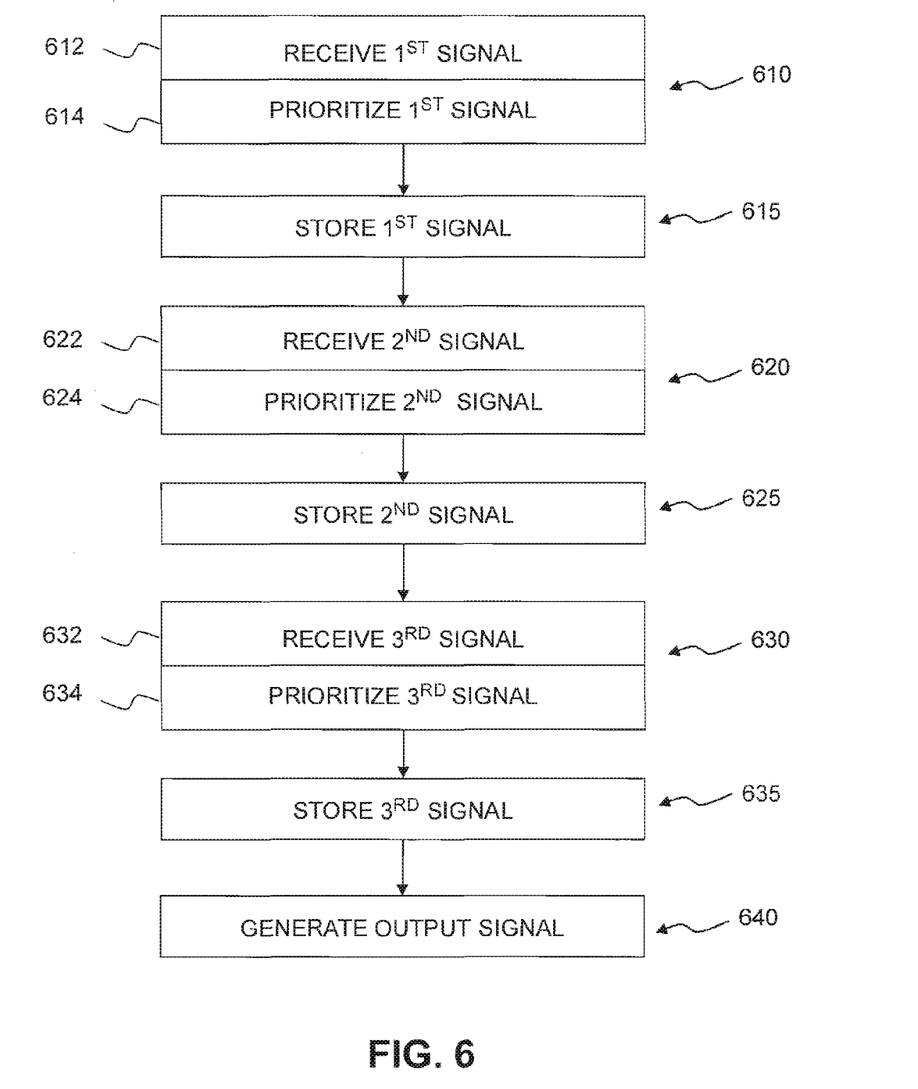
FIG. 6 is a flowchart showing the operation of a data collation and output program.

Collating server 18 is a general purpose server having utility/software 600 thereon for collating data streams from testing interface computer 12, first automated data source 14, and second automated data source 16 into a single output data stream suitable for being received by electronic device 10. Software 600 thereby transforms server 18 into collating server 18. Software 600 essentially operates as an abstraction layer for device 10. All input/output is controlled through a command interpreter via a network socket connection on an embedded processor. Test protocols 32 are written independently of the device 10 using only the functionality published through the command interpreter which creates an abstraction layer for the device 10. Changes and revisions to device 10 can be made and recompiled without altering the command interface that is the basis of the associated test protocols 32.

In general, a computer implemented system according to the principles of the present disclosure includes first message receiving and prioritizing sequence 610, first message storing sequence 615, second message receiving and prioritizing sequence 615, second message storing sequence 620, third message receiving and prioritizing sequence 625, third message storing sequence 630, and output data stream generation sequence 635.

First message receiving and prioritizing sequence 610 includes code for execution by a processor of collating server 18 for performing a plurality of functions. More specifically, as depicted at 612, a first signal is received from a first source such as first automated data source 14. Additionally, as depicted at 614, a priority is assigned to the first signal. The priority assigned is, in the present example, assigned at least partially because the signal comes from first automated data source 14. Signals from first automated data source 14 are given the highest priority. In the example where electronic device 10 is an embedded GPS device, an aiding server provides an example of first automated data source 14 that would result in signals therefrom being assigned the highest priority. Any incoming signal that is the product of an interrupt handler is given either the highest or middle priority.

First message storing sequence 615 includes code for execution by a processor of collating server 18 for storing the first signal data. The storage of the first signal may be for an extremely short amount of time if the data of the signal is ready to be output as described below. The first signal data, because it is assigned the highest priority, is stored in an active/inactive buffer scheme until it is called for output. Accordingly, the storage of the data is dependent on the priority assigned to the data.

Second message receiving and prioritizing sequence 620 includes code for execution by a processor of collating server 18 for performing a plurality of functions. More specifically, as depicted at 622 a second signal is received from a second source such as second automated data source 16. Additionally, as depicted at 624, a priority is assigned to the second signal. The priority assigned is, in the present example, assigned at least partially because the signal comes from second automated data source 16. Signals from second automated data source 16 are given a medium priority. In the example where electronic device 10 is an embedded GPS device, a timing server provides an example of second automated data source 16 that would result in signals therefrom being assigned the medium priority. Additionally, a log service output message is given a medium priority.

Second message storing sequence 625 includes code for execution by a processor of collating server 18 for storing the second signal data. The second signal data, because it is assigned the medium priority, is stored in an active/inactive buffer scheme until it is called for output. Again, the storage of the data is dependent on the priority assigned to the data.

Third message receiving and prioritizing sequence 630 includes code for execution by a processor of collating server 18 for performing a plurality of functions. More specifically, as depicted at 632 a third signal is received from a third source such as testing interface computer 12. Additionally, as depicted at 634, a priority is assigned to the third signal. The priority assigned is, in the present example, assigned at least partially because the signal comes from testing interface computer 12. Signals from testing interface computer 12 are given the lowest priority.

Third message storing sequence 635 includes code for execution by a processor of collating server 18 for storing the third signal data. The third signal data, because it is assigned the lowest priority, is stored in a circular queue until it is called for output. Again, the storage of the data is dependent on the priority assigned to the data.

Figure 8:
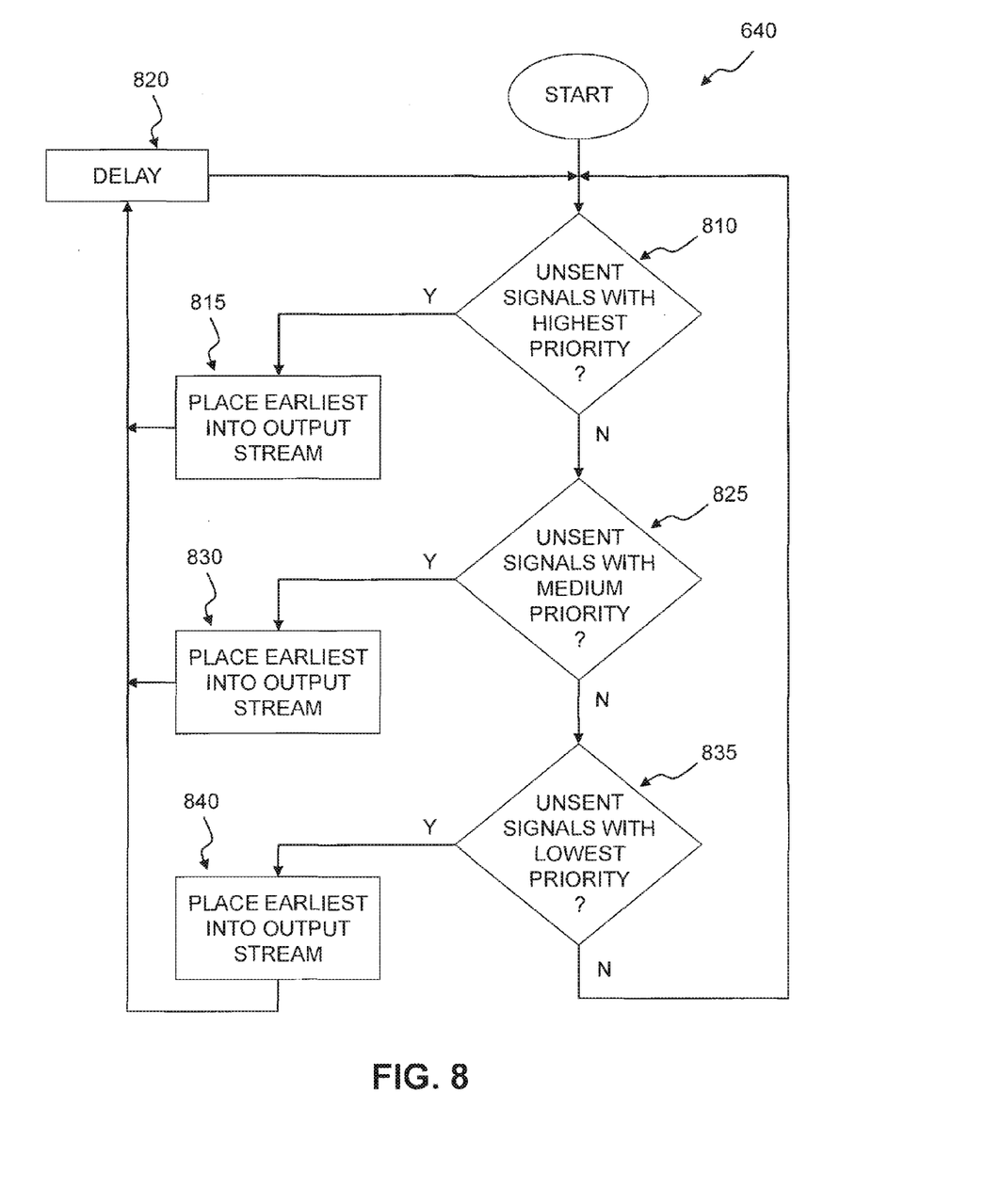
FIG. 8 is a flowchart showing the operation of a portion of the program of FIG. 6.

Output generating sequence 640 includes code for execution by a processor of collating server 18 for generating an output of collating server 18. The generation of the output sequence is performed according to a plurality of rules embodied in a plurality of sub-sequences, as shown in FIG. 8.

The computer implemented output generation sequence 640 according to the principles of the present disclosure includes first priority signal detection sequence 810, first priority signal output sequence 815, delay sequence 820, second priority signal detection sequence 825, second priority signal output sequence 830, third priority signal detection sequence 835, and third priority signal output sequence 840.

First priority signal detection sequence 810 includes code for execution by a processor of collating server 18 for detecting if any unsent signals are stored in the active/inactive buffer scheme having the highest priority. If unsent highest priority signals are found, the processor of collating server 18 invokes first priority signal output sequence 815. If no unsent highest priority signals are found, the processor of collating server 18 invokes second priority signal detection sequence 825.

First priority signal output sequence 815 includes code for execution by the processor of collating server 18 for placing the earliest received stored signal having the highest priority into an output stream of collating server 18. Once first priority signal output sequence 815 concludes, the processor of collating server 18 continues to delay sequence 820.

Delay sequence 820 includes code for execution by the processor of collating server 18 for inserting a delay between signals in the output stream from collating server 18. The amount of time prescribed by delay sequence 820 is set, or pre-defined, by the programmer. The programmer sets the delay time to allow the quickest output of adjacent signals while still conforming to the input needs of electronic device 10 to maintain a desired reliability thereof. For example, electronic device 10 may require a separation of adjacent signals of 20 ms to achieve the desired reliability, otherwise known as a message interrupt constraint. Signals received in violation of this 20 ms spacing can result in disabling of a message interrupt system of electronic device 10. Such disabling of the message interrupt system can cause loss of data, instability of electronic device 10, and test failure.

As previously noted, if no unsent highest priority signals are found in first priority signal detection sequence 810, the processor of collating server 18 invokes second priority signal detection sequence 825. Second priority signal detection sequence 825 includes code for execution by a processor of collating server 18 for detecting if any unsent signals are stored in the active/inactive buffer scheme having the middle priority. If unsent middle priority signals are found, the processor of collating server 18 invokes second priority signal output sequence 830 followed by delay sequence 820. If no unsent middle priority signals are found, the processor of collating server 18 invokes third priority signal detection sequence 835.

Second priority signal output sequence 830 includes code for execution by the processor of collating server 18 for placing the earliest received stored signal having the middle priority into an output stream of collating server 18. Once second priority signal output sequence 830 concludes, the processor of collating server 18 continues to delay sequence 820.

As previously noted, if no unsent middle priority signals are found in second priority signal detection sequence 825, the processor of collating server 18 invokes third priority signal detection sequence 835. Third priority signal detection sequence 835 includes code for execution by a processor of collating server 18 for detecting if any unsent signals are stored in the circular queue having the lowest priority. If unsent lowest priority signals are found, the processor of collating server 18 invokes third priority signal output sequence 840. If no unsent lowest priority signals are found, the processor of collating server 18 returns to step first priority signal detection sequence 810. It should be appreciated that in this case, the processor need not go through delay sequence 820 because no message has been placed in the output stream since the last time the delay sequence 820 was invoked.

It should be appreciated that while three levels of priority are discussed and shown in FIG. 8, additional levels of priority can be assigned, additional priority signal detection sequences can be employed, and additional signal output sequences can be used as appropriate.

Figure 5:
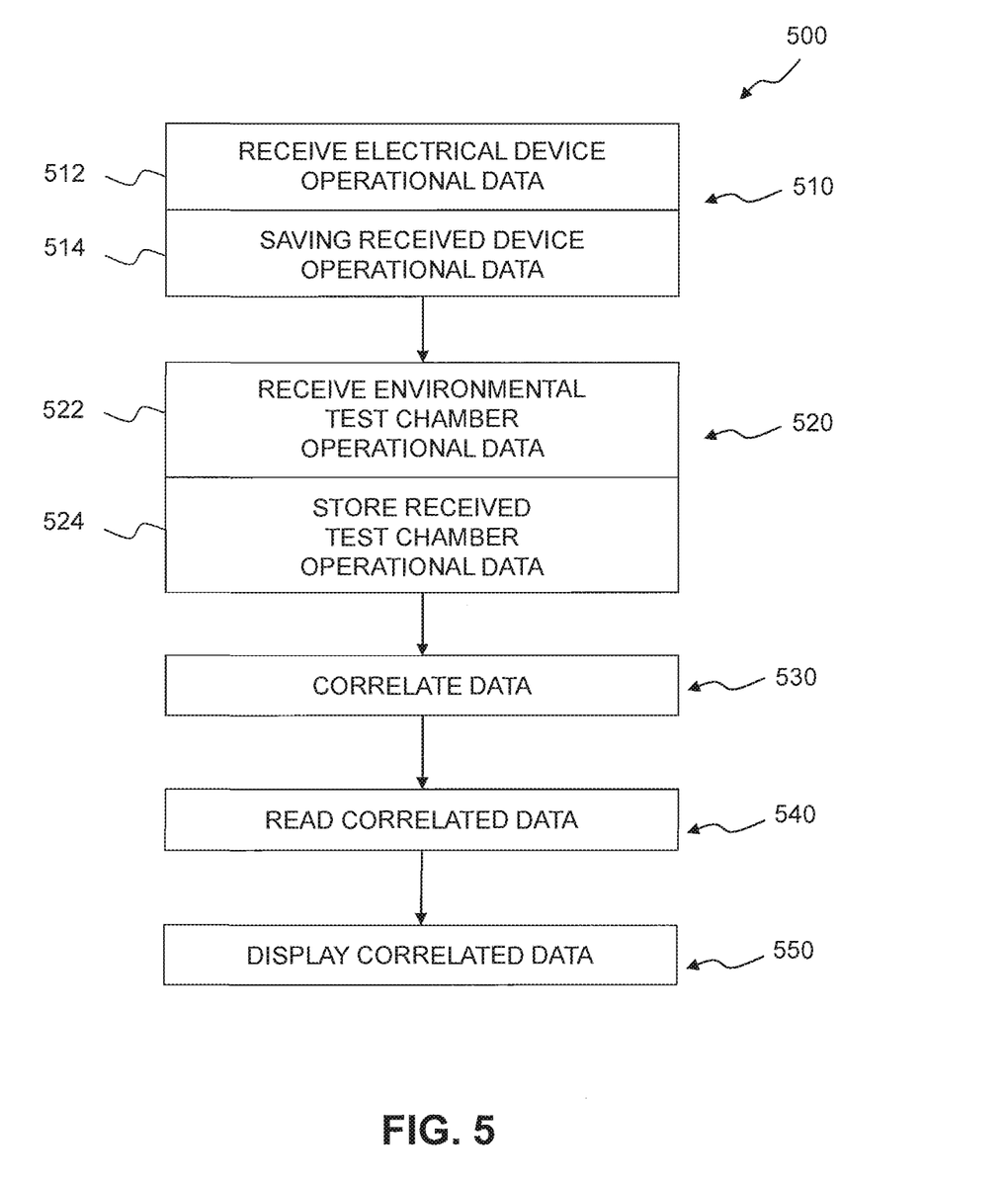
FIG. 5 is a flowchart showing the operation of a data collection and serving program.

Reporting database 20 is a standard database suitable for storing and organizing quantities of data from testing systems 12, 14, 16, 18, 26 and monitored devices 10. While database 20 is depicted as a standalone database, it should be appreciated that database 20 may be any storage medium capable of carrying out the functions ascribed thereto. Database 20 runs and/or facilitates a monitoring utility 500 designed to detect failures (and operations generally) induced through environmental test conditions by invoking tasks typical to the intended working environment and monitoring the system for warnings and errors. Utility 500 quietly records any exceptions encountered by electronic device 10 to an event log. This event log can later be viewed and addressed by the test administrator. Additionally, utility 500 records inputs provided to electronic device 10 from testing interface computer 12, automated data sources 14, 16, and collating server 18 with time stamps. Utility 500 likewise records outputs provided by device 10 and conditions imposed on device 10 by environmental chamber 24 with time stamps. In this way, the stability of the entire system is constantly being checked and any pertinent information is time stamped and recorded into a user-specified log file which can later be compared against a timeline of environmental conditions, provided by chamber 24 or otherwise, for evaluation. Utility 500 is invoked from a command line by inputting the name of the executable utility 500 with the pathname of a valid data monitoring profile and optional pathnames of log files to which output will be appended. File specifications may contain universal naming convention references allowing output to be logged to a remote machine or database 20.

Monitoring profiles include a plurality of variables that can be set by a user. Some of these variables/settings include settings that allow controlling a collection of trials as a set. Such settings include "Delay," which defines a minimum delay in seconds between trial sets (the default is zero). "Iterations" sets a maximum number of iterations permitted for the trial set (the default is unlimited). "Seconds" sets a maximum number of seconds to consecutively run the trial set (the default is unlimited). "Errors" sets a maximum number of errors before disabling the trial set (the default is unlimited). "Verbose" sets the output type to include more detail (the default is to output errors only). "[N]" is a value between 1 and 255 (inclusive) and identifies the trial number. "Trial" is a command-line invoking the desired trial utility.

Figure 7A:
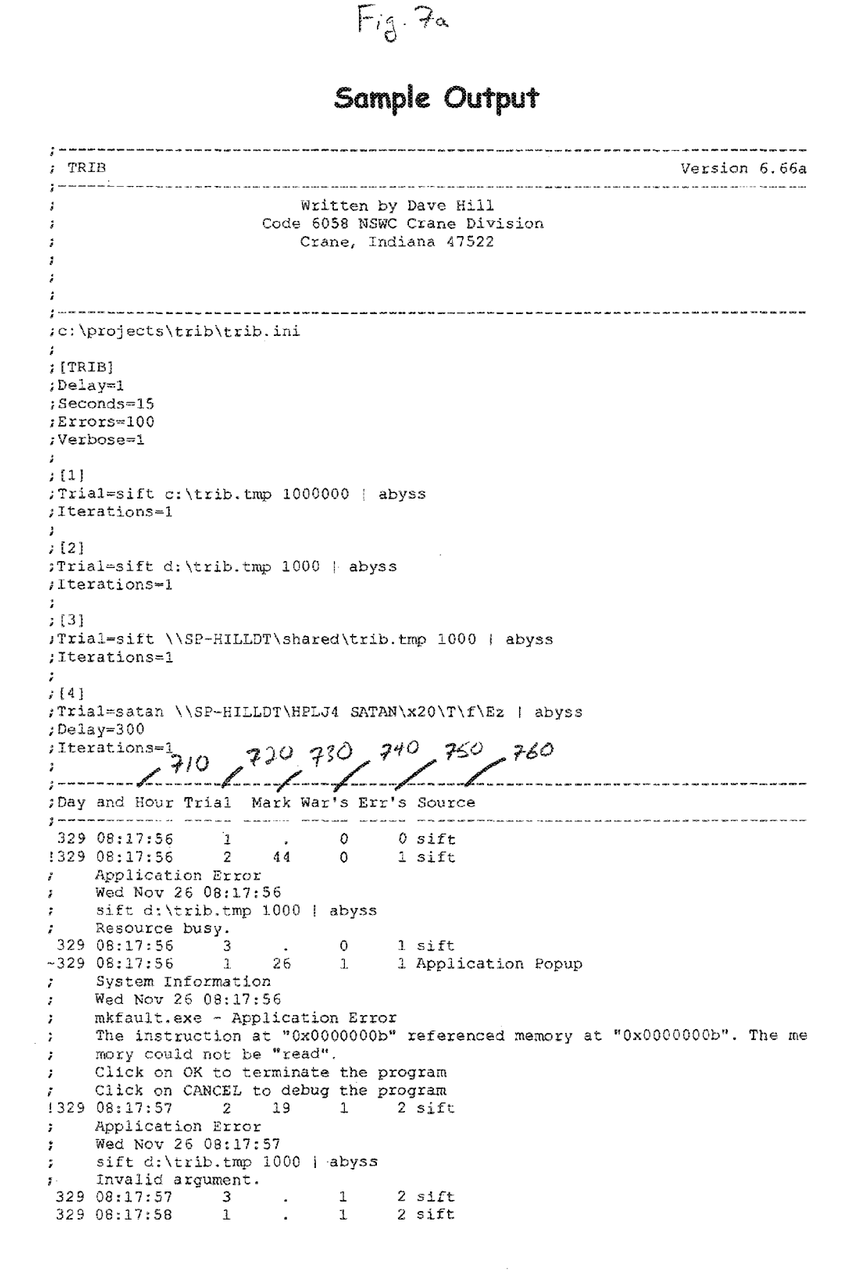
FIG. 7 is a sample output generated as part of the program of FIG. 5.
Figure 7B:
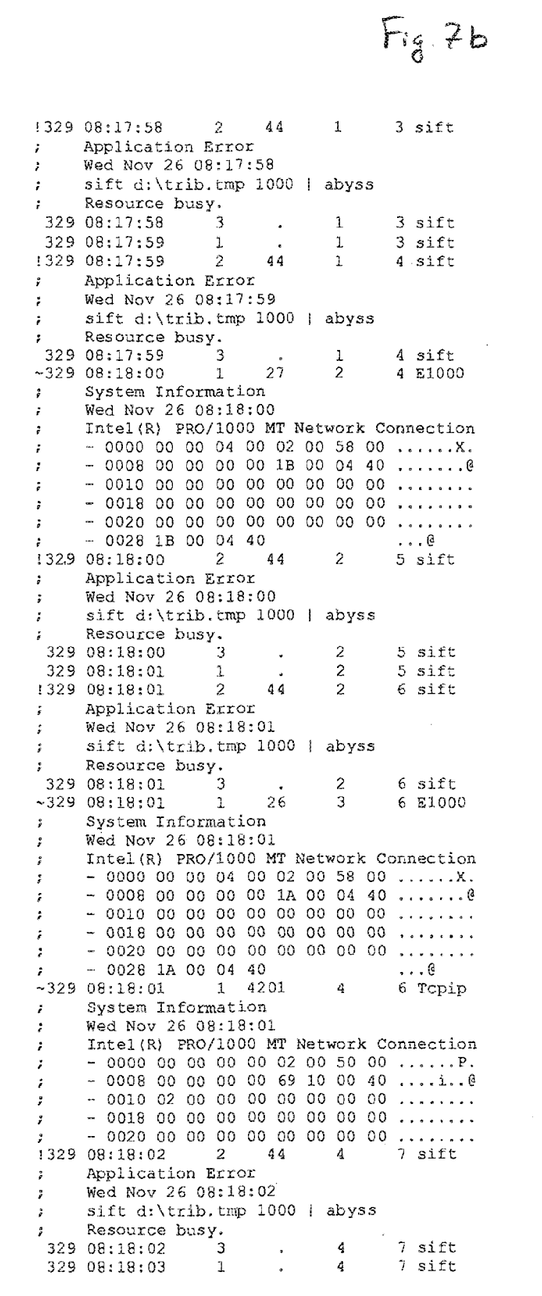
Figure 7C:
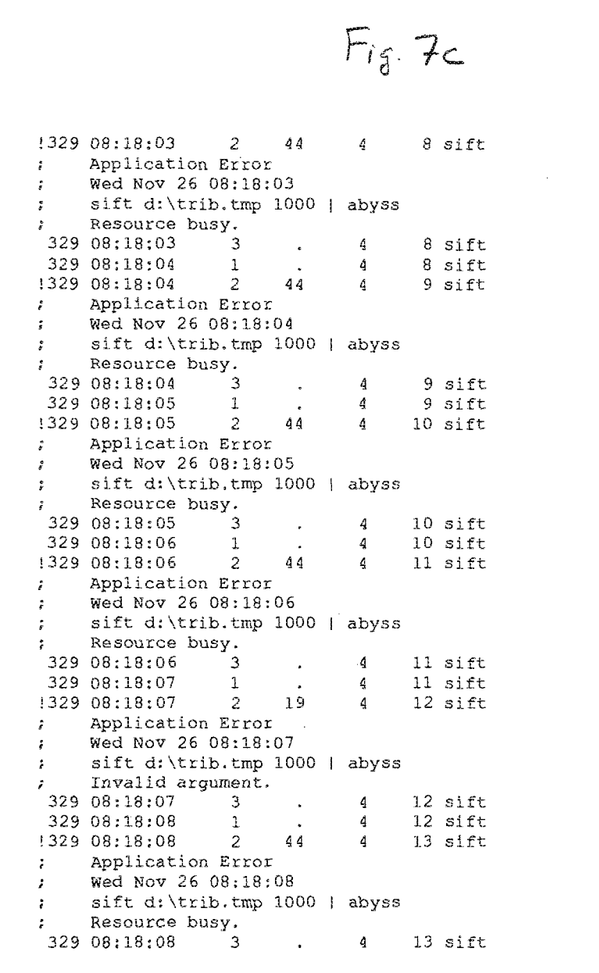

The output of utility 500 consists of lines of text prefixed by one of four possible character identifiers. A sample output is provided in FIGS. 7a-c. In the output, a semicolon ";" indicates a comment, a blank indicates a success, a tilde "~" indicates a warning, and an exclamation "!" indicates an error. With the exception of comments, each output line consists of data broken across six fields. The six fields include "Day an Hour" 710, "Trial" 720, "Mark" 730, "War's" 740, "Err's" 750, and "Source" 760. "Day an Hour" 710 indicates the day and time of the trial. This data is retrieved from the timestamps of the provided data. "Trial" 720 indicates a trial ID for the associated command. "Mark" 730 indicates the trial result. A numerical value for "Mark" 730 represents an error code, a period "." represents a success. "War's" 740 indicates the cumulative warnings. Warnings are system generated events that indicate a situation that is not immediately problematic or significant with respect to present system operation but that may indicate a future problem. "Err's" 750 indicates the cumulative errors. Errors are system generated events that are indicative of a significant present operational problem, such as loss of data. "Source" 760 indicates the source that generated the output line. Sources may include any support program run by utility 500, discussed below.

In addition to recording the various inputs, processes, outputs, and conditions related to device 10, all of this data is accessible to reporting display computer 22. Reporting display computer 22 can retrieve the stored data to re-create the events of the testing session by reading the output of utility 500. Additionally, display computer 22 can display the various pieces of data as received to generate a substantially real-time display of the data. Additionally, by recording errors/exceptions in addition to overall operational failures, utility 500 can be used to find errors such as necessary computing retries that slow down the computing process but don't cause the overall operation to fail. Thus, a different test that only checks to determine if a correct response is returned may miss that substantial errors are being generated and that the computing is operating in an inefficient manner due to significant retries or otherwise.

Environmental chamber 24 provides a controlled environment in which to test electronic device 10. Environmental chamber 24 is controlled by chamber control computer 26. Via chamber control computer 26, environmental chamber 24 can impart various environmental conditions upon electronic device 10. Such conditions include, but are not limited to, temperatures, atmospheric pressures, humidity, and vibrations. Additionally, test protocols invoked on testing interface computer 12 can include instructions that when transmitted to chamber control computer 26 invoke desired environmental conditions to be applied to electronic device 10 as part of the test protocol.

Referring now to FIG. 5, there is depicted a diagram of the various processing sequences and data structures employed by the present system and method in utility 500. In general, a computer implemented system according to the principles of the present disclosure includes an electrical device operational data receiving and storing sequence 510, an environmental chamber operational data receiving and storing sequence 520, a data correlation sequence 530, a correlated data reading sequence 540, and a data displaying sequence 550. The functions of these processing sequences involve the use of user interfaces and command sets that are described in more detail herein.

Operational data receiving and storing sequence 510 includes code for execution by a processor in communication with database 20 for performing a plurality of functions. More specifically, as depicted at 512, operational data receiving and storing sequence 510 receives operational data from electronic device 10, testing interface computer 12, first automated data source 14, second automated data source 16, and collating server 18. This received data is at least partially based on user input via input devices coupled to testing interface computer 12 (e.g. tests chosen and identification of electronic device 10). Furthermore, as depicted at 514, the operational data is saved in a format that groups it with other data from the same test session.

Environmental chamber operational data receiving and storing sequence 520 includes code for execution by a processor in communication with database 20 for performing a plurality of functions. More specifically, as depicted at 522, environmental chamber operational data receiving and storing sequence 520 receives operational data from chamber control computer 26. This received data is indicative of the environmental conditions provided by environmental chamber 24 and experienced by electronic device 10. Furthermore, as depicted at 524, the environmental operational data is saved in a format that groups it with other data from the same session.

Data correlation sequence 530 includes code for execution by a processor in communication with database 20. The code calls for the correlation of the electrical device operational data with the test chamber operational data. This correlation takes the form of being associated with the same test sequence and also by comparing timestamps of the data to organize it into an order that is consistent with the order in which the events represented by the data points occurred.

Correlated data reading sequence 540 includes code for execution by a processor, such as a processor within reporting display computer 22. The code calls for the reading of the correlated data from within reporting database 20. It should be appreciated that while the correlation of data correlation sequence 530 can occur within reporting database 20 and then be subsequently read out of reporting database 20 during correlated data reading sequence 540, other embodiments are contemplated where data correlation sequence 530 occurs within reporting display computer 22 and correlated data reading sequence 540 involves the processor within reporting display computer 22 reading the data previously correlated by the processor within reporting display computer 22.

Data displaying sequence 550 includes code for execution by a processor, such as the processor within reporting display computer 22. The code calls for the displaying of the correlated operational data. This displaying occurs on a display such as the display that is part of reporting display computer 22. The displaying may take a plurality of forms as desired and requested by a user of reporting display computer 22. One such form includes a display of the correlated data such that a substantially real-time representation of the data is provided.

The foregoing description of the invention is illustrative only, and is not intended to limit the scope of the invention to the precise terms set forth. Although the invention has been described in detail with reference to certain illustrative embodiments, variations and modifications exist within the scope and spirit of the invention as described and defined in the following claims.

What is claimed is:

1. A computer implemented system for conducting testing of electronic devices, including:
   a nontransitory computer readable storage medium storing a plurality of machine readable processing sequences, said plurality of processing sequences comprising:
      a first processing sequence that retrieves a first data specification for a first electronic device species according to a first plurality of commands specified by a user;
      a second processing sequence that retrieves a first test protocol according to a second plurality of commands specified by a user, the first test protocol being configured to test any species of electronic device within a genus of electronic devices;
      a third processing sequence that executes the first test protocol to generate a first data structure, the first data structure being generic with respect to species within the genus of electronic devices;
      a fourth processing sequence that interprets the first data specification for the first electronic device species and extracts data from the first data structure according to the interpretation of the first data specification;
      a fifth processing sequence that generates a second data structure specific to the first electronic device species using data extracted from the first data structure and according to instruction contained within the first data specification for the first electronic device species;
      a sixth processing sequence that outputs the second data structure to a first device of the first electronic device species;
      a seventh processing sequence that receives a third data structure from the first device of the first electronic device species; and
      an eighth processing sequence that interprets the data specification for the first electronic device species and extracts data from the third data structure according to the interpretation of the first data specification.

2. The system of claim 1, further including a ninth processing sequence that generates a fourth data structure that is based off the third data structure, the fourth data structure is generic with respect to species of electronic devices within the genus of electronic devices.

3. The system of claim 2, further including a tenth processing sequence that extracts data from the fourth data structure and compares the extracted data to expected result data, wherein extracted data that matches the expected result data is reported as passing the test embodied in the first test protocol and failure of the extracted data to match the expected result data is reported as failing the test embodied in the first test protocol.

4. The system of claim 3, wherein the tenth processing sequence includes comparing the extracted data to an interface control document.

5. The system of claim 2, wherein the fourth data structure is a comma delimited file.

6. The system of claim 1, further including an eleventh processing sequence that retrieves a second data specification for a second electronic device species according to a third plurality of commands specified by a user;
    a twelfth processing sequence that retrieves a second test protocol according to a fourth plurality of commands specified by the user, the second test protocol being configured to test any species of electronic device within a genus of electronic devices;
    a thirteenth processing sequence that executes the second test protocol to generate a fifth data structure;
    a fourteenth processing sequence that interprets the second data specification for the second electronic device species and extracts data from the fifth data structure according to the interpretation of the second data specification; and
    a fifthteenth processing sequence that generates a sixth data structure specific to the second electronic device species using data extracted from the fifth data structure and according to instruction contained within the second data specification for the second electronic device species.

7. The system of claim 1, further including an eleventh processing sequence that retrieves a second data specification for a second electronic device species according to a third plurality of commands specified by a user;
    a sixteenth processing sequence that retrieves the first test protocol according to a fifth plurality of commands specified by the user;
    a seventeenth processing sequence that executes the first test protocol to generate a first data structure;
    an eighteenth processing sequence that interprets the second data specification for the second electronic device species and extracts data from the first data structure according to the interpretation of the second data specification; and
    a nineteenth processing sequence that generates a seventh data structure specific to the second electronic device species using data extracted from the first data structure and according to instruction contained within the second data specification for the second electronic device species.

8. A non-transitory computer readable medium storing code for controlling a testing system to dynamically generate a client-type-specific testing instruction and client-type-generic testing response, the code including instructions to:
    retrieve a data specification for an electronic device species in response to a first plurality of commands specified by a user;
    retrieve a test protocol in response to a second plurality of commands specified by a user, the test protocol describing a test suitable for any species of electronic device within a genus of electronic devices;
    execute the test protocol to generate a first data structure, the first data structure being generic with respect to species within the genus of electronic devices;
    extract data from the first data structure;
    generate a second data structure by organizing the extracted data according to instructions provided by the data specification for the electronic device species;
    receive a third data structure generated by a device of the electronic device species;
    extract data from the third data structure according to instructions present within the data specification for the electronic device species; and
    generate a fourth data structure by organizing the data extracted from the third data structure according to instructions provided by the data specification for the electronic device species.

9. The non-transitory computer readable medium of claim 8, wherein the second data structure is configured to be specific to one species of electronic device within the genus of electronic devices.

10. The non-transitory computer readable medium of claim 8, wherein the first data structure is unusable by any species within the genus of electronic devices.

11. The non-transitory computer readable medium of claim 8, wherein the code further includes instructions to:
    extract data from the fourth data structure;
    compare the extracted data from the fourth data structure to expected result data, wherein extracted data from the fourth data structure that matches the expected result data is reported as passing the test embodied in the first test protocol and failure of the extracted data from the fourth data structure to match the expected result data is reported as failing the test embodied in the first test protocol.

12. The non-transitory computer readable medium of claim 11, wherein the instruction to compare the extracted data from the fourth data structure to expected result data includes an instruction to compare the extracted data from the fourth data structure to an interface control document.

13. The non-transitory computer readable medium of claim 8, wherein the code further includes instructions to:
    retrieve a second data specification for a second electronic device species according to a third plurality of commands specified by a user;
    retrieve a second test protocol according to a fourth plurality of commands specified by the user, the second test protocol being configured to test any species of electronic device within a genus of electronic devices;
    execute the second test protocol to generate a fifth data structure;
    interpret the second data specification for the second electronic device species;
    extract data from the fifth data structure according to the interpreting of the second data specification; and
    generate a sixth data structure specific to the second electronic device species using data extracted from the fifth data structure and according to instruction contained within the second data specification for the second electronic device species.

14. The non-transitory computer readable medium of claim 8, wherein the code further includes instructions to:
    retrieve a second data specification for a second electronic device species according to a third plurality of commands specified by a user;
    retrieve the first test protocol according to a fifth plurality of commands specified by the user;

execute the first test protocol to generate a first data structure;
interpret the second data specification for the second electronic device species;
extract data from the first data structure according to the interpreting of the second data specification; and
generate a seventh data structure specific to the second electronic device species using data extracted from the first data structure and according to instruction contained within the second data specification for the second electronic device species.

15. A software conversion system comprising:
a user interface adapted to permit a user to control processing and to select input files,
non-transitory computer readable storage medium comprising a plurality of machine readable instructions comprising a first system for converting a first plurality of control system data into a second plurality of control system data, wherein said first plurality of control system data is generic with respect to at least a first target system, said second plurality of control system data is specific with respect the first target system, the first system converting the first plurality of control system data into the second plurality of control system data by associating bit representations of the first plurality of control system data with a first plurality of predetermined data identifiers associated with said second control system data, wherein said user interface is further adapted to permit a user to manually associate said first plurality of bit representations with said first plurality of predetermined data identifiers.

* * * * *